(12) United States Patent
Aoki

(10) Patent No.: US 10,879,188 B2
(45) Date of Patent: Dec. 29, 2020

(54) WIRING SUBSTRATE

(71) Applicant: SHINKO ELECTRIC INDUSTRIES CO., LTD., Nagano (JP)

(72) Inventor: Nobutaka Aoki, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/388,046

(22) Filed: Apr. 18, 2019

(65) Prior Publication Data

US 2019/0326224 A1 Oct. 24, 2019

(30) Foreign Application Priority Data

Apr. 23, 2018 (JP) ................................ 2018-082294

(51) Int. Cl.
*H01L 23/538* (2006.01)
*H01L 23/31* (2006.01)
*H01L 23/00* (2006.01)

(52) U.S. Cl.
CPC ...... *H01L 23/5389* (2013.01); *H01L 23/3128* (2013.01); *H01L 23/5383* (2013.01); *H01L 24/16* (2013.01); *H01L 2224/16227* (2013.01)

(58) Field of Classification Search
CPC . H01L 23/5329–53295; H01L 23/498–49894; H01L 23/49503–49513; H01L 21/76801–76837; H01L 21/76802–76817; H01L 21/76877–76883; H01L 24/19; H01L 21/4857; H01L 23/3128
See application file for complete search history.

(56) References Cited

U.S. PATENT DOCUMENTS

2016/0141236 A1 5/2016 Kurita
2016/0322295 A1 11/2016 Kobayashi et al.

FOREIGN PATENT DOCUMENTS

JP 2016-096292 5/2016
JP 2016-207958 12/2016

*Primary Examiner* — Tucker J Wright
(74) *Attorney, Agent, or Firm* — Rankin, Hill & Clark LLP

(57) ABSTRACT

A wiring substrate includes a pad including an opening formed to penetrate the pad, a first insulation layer having a cavity to which the pad is exposed, an electronic component mounted on the pad exposed in the cavity, and a second insulation layer formed on the first insulation layer with covering the electronic component. The opening is formed so as to penetrate the pad which is exposed in the cavity. The electronic component is mounted on the pad so that the opening is exposed. An outermost layer of the electronic component includes a concave portion having a predetermined volume distribution. A position and a size of the opening are determined based on the predetermined volume distribution. The second insulation layer is provided in the concave portion, in a gap between a side surface of the electronic component and an inner wall surface of the cavity, and in the opening.

16 Claims, 12 Drawing Sheets

FIG. 11A
FIG. 11B
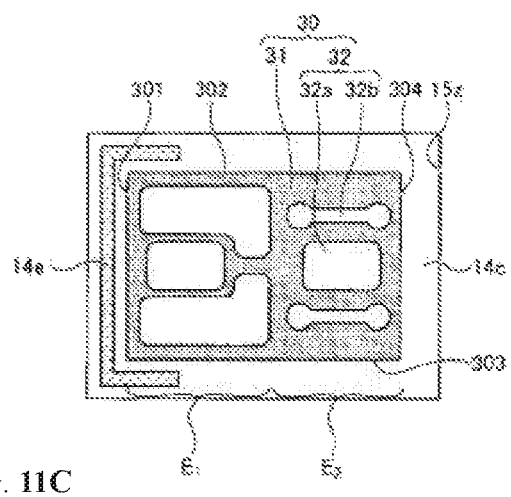
FIG. 11C
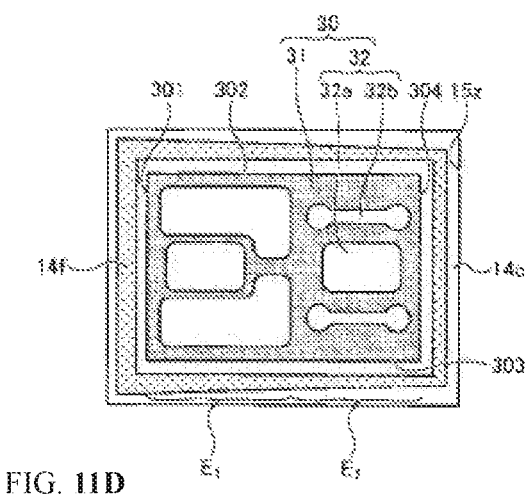
FIG. 11D
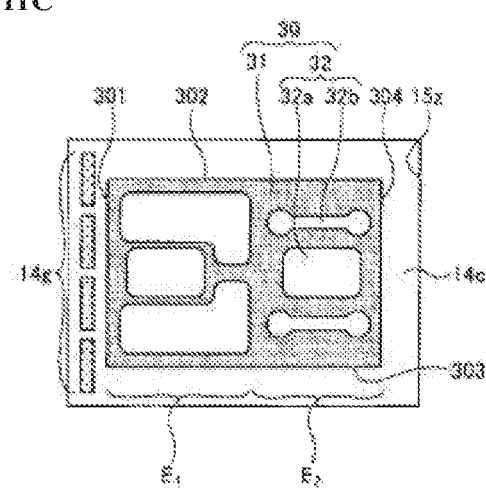
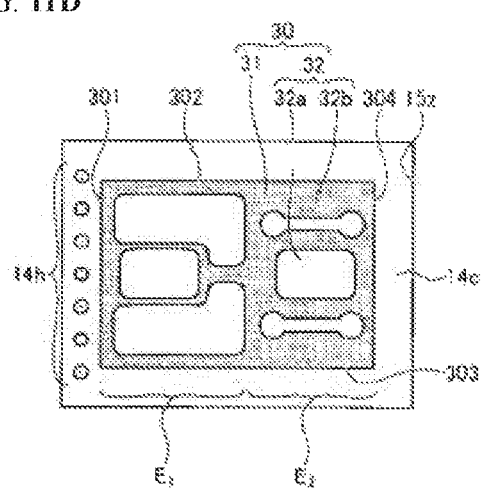
FIG. 11E
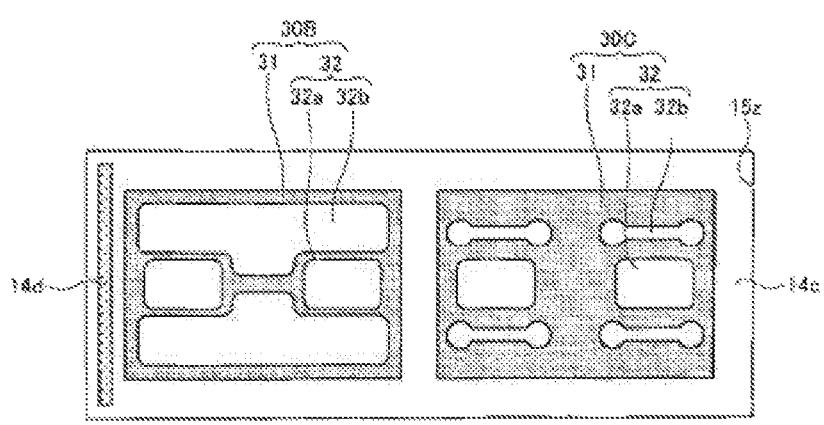

WIRING SUBSTRATE

CROSS-REFERENCE TO RELATED APPLICATION

The present application claims priority under 35 USC 119 from Japanese Patent Application No. 2018-082294 filed on Apr. 23, 2018.

TECHNICAL FIELD

The present disclosure relates to a wiring substrate.

RELATED ART

In the related art, a wiring substrate where electronic components are mounted in cavities formed in a first insulation layer has been known. The wiring substrate has a second insulation layer formed on the first insulation layer so as to cover the electronic components, and a wiring pattern formed on an upper surface of the second insulation layer, for example. The wiring pattern is electrically connected to electronic component pads through via-holes formed in the second insulation layer.

Patent Document 1: JP-A-2016-096292
Patent Document 2: JP-A-2016-207958

However, a wiring layer including the pads is formed on surfaces of the electronic components to be covered with the second insulation layer, so that parts not formed with the wiring layer become concave portions. Alternatively, a protective layer configured to cover the wiring layer is formed on the surfaces of the electronic components to be covered with the second insulation layer, so that openings configured to expose the wiring layer (pad) formed on the protective layer become concave portions. In any case, volumes of the concave portions to be formed on the surfaces of the electronic components are different depending on places.

For this reason, when forming the second insulation layer configured to cover the electronic components by a resin, more resin flows into the concave portions having large volumes in some regions, and less resin flows into the concaves portion having small volumes in the other region. As a result, a thickness of the second insulation layer to be formed on the surfaces of the electronic components may be unequal depending on a volume distribution of the concave portions.

When the thickness of the second insulation layer to be formed on the surfaces of the electronic components is unequal, the thicker the thickness of the second insulation layer is, the deeper the via-hole is and the smaller an area of a bottom portion of the via-hole (=an area of the electronic component pad to be exposed to the bottom portion of the via-hole) is. As a result, the thicker the thickness of the second insulation layer is, connection reliability through the via-hole between the wiring pattern formed on the upper surface of the second insulation layer and the electronic component pad is lowered.

SUMMARY OF INVENTION

Aspect of non-limiting embodiments of the present disclosure relates to provide a wiring substrate which can improve connection reliability through a via-hole between a wiring pattern formed on an upper surface of an insulation layer configured to cover an electronic component and a pad of the electronic component pad.

Aspects of certain non-limiting embodiments of the present disclosure address the features discussed above and/or other features not described above. However, aspects of the non-limiting embodiments are not required to address the above features, and aspects of the non-limiting embodiments of the present disclosure may not address features described above.

According to an aspect of the present disclosure, there is provided a wiring substrate comprising:

a pad for electronic component mount, the pad including an opening formed to penetrate the pad;

a first insulation layer having a cavity to which a portion of the pad is exposed;

an electronic component mounted on the portion of the pad exposed in the cavity; and a second insulation layer formed on the first insulation layer with covering the electronic component, wherein the opening is formed so as to penetrate the portion of the pad which is exposed in the cavity, and the electronic component is mounted on the portion of the pad so that the opening is exposed, wherein an outermost layer of the electronic component facing toward the second insulation layer is formed with a concave portion having a predetermined volume distribution, wherein a position and a size of the opening are determined on the basis of the predetermined volume distribution, and wherein the second insulation layer is provided in the concave portion, provided in a gap between a side surface of the electronic component and an inner wall surface of the cavity, and provided in the opening.

According to the exemplary embodiment of the invention, it is possible to a wiring substrate which can improve connection reliability through a via-hole between a wiring pattern formed on an upper surface of an insulation layer configured to cover an electronic component and a pad of the electronic component pad.

BRIEF DESCRIPTION OF DRAWINGS

Exemplary embodiments of the present invention will be described in detail based on the following figures, wherein:

FIGS. 11A to 11E are partial plan views exemplifying diverse planar shapes of an opening to be formed in a pad for electronic component mount.

DESCRIPTION OF EMBODIMENTS

Figure 1A:
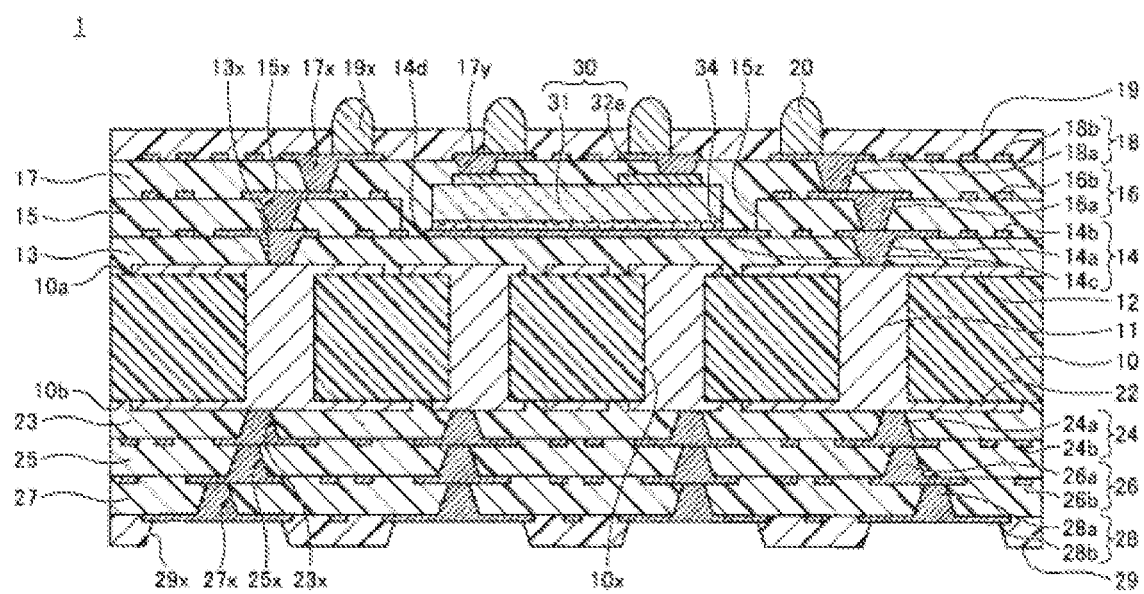
FIGS. 1A and 1B are views exemplifying a wiring substrate in accordance with a first exemplary embodiment.

Hereinafter, exemplary embodiments of the present disclosure will be described with reference to the drawings. Meanwhile, in the respective drawings, the same constitutional parts are denoted with the same reference numerals, and the overlapping descriptions thereof may be omitted.

Structure of Wiring Substrate of First Exemplary Embodiment

Figure 1B:
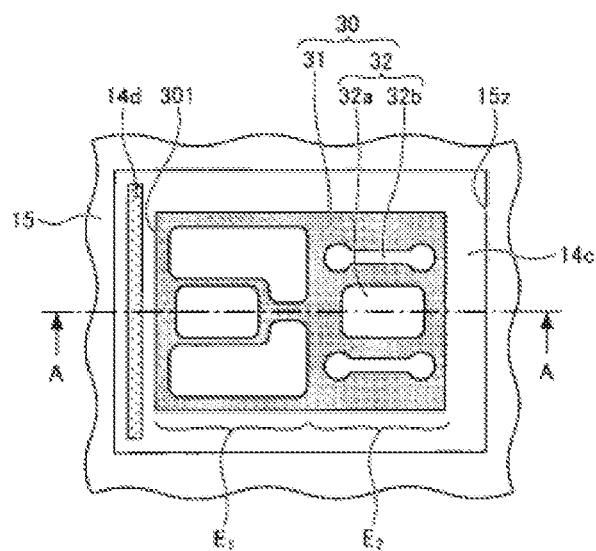

First, a structure of a wiring substrate of a first exemplary embodiment is described. FIGS. 1A and 1B are views exemplifying the wiring substrate in accordance with the first exemplary embodiment, in which FIG. 1A is a sectional view and FIG. 1B is a partial plan view depicting a cavity and an electronic component. In the meantime, the section of FIG. 1A in the vicinity of the cavity and the electronic component is a section taken along a line A-A of FIG. 1B. Also, in FIG. 1B, upper layers (an insulation layer 17, a wiring layer 18, a solder resist layer 19, and an external connection terminal 20) of an electronic component 30 are not shown.

Referring to FIG. 1A, a wiring substrate 1 is a wiring substrate where a wiring layer and an insulation layer are stacked on both surfaces of a core layer 10, and an electronic component 30 is embedded at one side of the core layer 10.

Specifically, in the wiring substrate 1, a wiring layer 12, an insulation layer 13, a wiring layer 14, an insulation layer 15, a wiring layer 16, an insulation layer 17, a wiring layer 18, and a solder resist layer 19 are sequentially stacked on one surface 10a of the core layer 10. Also, a wiring layer 22, an insulation layer 23, a wiring layer 24, an insulation layer 25, a wiring layer 26, an insulation layer 27, a wiring layer 28, and a solder resist layer 29 are sequentially stacked on the other surface 10b of the core layer 10.

Meanwhile, in the first exemplary embodiment, for convenience sake, the solder resist layer 19-side of the wiring substrate 1 is referred to as 'upper side' or 'one side', and the solder resist layer 29-side is referred to as 'lower side' or 'other side'. Also, a surface of each part facing toward the solder resist layer 19 is referred to as 'one surface' or 'upper surface', and a surface facing toward the solder resist layer 29 is referred to as 'other surface' or 'lower surface'. However, the wiring substrate 1 can be used with being vertically reversed and can be arranged at any angle. Also, the description 'as seen from above' indicates that a target object is seen in a normal direction of one surface 10a of the core layer 10, and a planar shape indicates a shape as seen from the normal direction of one surface 10a of the core layer 10.

As the core layer 10, for example, a so-called glass epoxy substrate where an insulating resin such as an epoxy-based resin is impregnated in glass cloth may be used. As the core layer 10, a substrate where an epoxy-based resin, a polyimide-based resin or the like is impregnated in woven fabric or non-woven fabric of glass fiber, carbon fiber, aramid fiber and the like may also be used. A thickness of the core layer 10 may be set to about 60 to 400 μm, for example. The core layer 10 is formed with through-holes 10x penetrating the core layer 10 in a thickness direction. A planar shape of the through-hole 10x is circular, for example.

The wiring layer 12 is formed on one surface 10a of the core layer 10. Also, the wiring layer 22 is formed on the other surface 10b of the core layer 10. The wiring layer 12 and the wiring layer 22 are electrically interconnected by through-wirings 11 formed in the through-holes 10x. The wiring layers 12, 22 are respectively patterned into a predetermined planar shape. For the wiring layers 12, 22, and the through-wiring 11, copper (Cu) or the like may be used, for example. A thickness of each of the wiring layers 12, 22 may be set to about 10 to 30 μm, for example. In the meantime, the wiring layer 12, the wiring layer 22 and the through-wirings 11 may be integrally formed, too.

The insulation layer 13 is formed on one surface 10a of the core layer 10 so as to cover the wiring layer 12. As a material of the insulation layer 13, for example, an insulating resin of which a main component is an epoxy-based resin or a polyimide-based resin, or the like may be used. A thickness of the insulation layer 13 may be set to about 30 to 40 μm, for example. The insulation layer 13 may contain a filler such as silica ($SiO_2$). A contained amount of the filler in the insulation layer 13 can be appropriately set, in correspondence to a required coefficient of thermal expansion.

The wiring layer 14 is formed at one side of the insulation layer 13. The wiring layer 14 includes via-wirings 14a filled in via-holes 13x penetrating the insulation layer 13 and formed to expose an upper surface of the wiring layer 12, a wiring pattern 14b formed on an upper surface of the insulation layer 13, and a pad 14c for electronic component mount formed on the upper surface of the insulation layer 13. The wiring pattern 14b is electrically connected to the wiring layer 12 through the via-wirings 14a. The via-hole 13x may be formed as a concave portion having an inverted conical shape of which a diameter of an opening opened toward the insulation layer 15 is larger than a diameter of a bottom surface of an opening formed by the upper surface of the wiring layer 12. A material of the wiring layer 14 and thicknesses of the wiring pattern 14b and the pad 14c for electronic component mount may be configured in the same manner as the wiring layer 12, for example.

The insulation layer 15 is formed on the upper surface of the insulation layer 13 so as to cover the wiring layer 14. A material and a thickness of the insulation layer 15 may be configured in the same manner as the insulation layer 13, for example. The insulation layer 15 may contain a filler such as silica ($SiO_2$). A contained amount of the tiller in the insulation layer 15 may be the same as in the insulation layer 13, for example.

The insulation layer 15 is formed with a cavity 15z configured to expose an upper surface of the pad 14c for electronic component mount. In the meantime, a region on the insulation layer 15 in which the cavity 15z is formed is not formed with the wiring layer 16. That is, the cavity 15z is formed in a non-formation region of the wiring layer 16 on the insulation layer 15. A planar shape of the cavity 15z can be appropriately determined, in conformity with a planar shape of an electronic component 30 to be arranged in the cavity 15z. When the planar shape of the electronic component 30 is rectangular, the cavity 15z may be formed to have a rectangular planar shape slightly larger than the electronic component 30. Also, for example, when the planar shape of the cavity 15z is rectangular, the pad 14c for electronic component mount may be formed to have a rectangular planar shape slightly larger than an outer shape of the cavity 15z. In the meantime, an outer shape of the electronic component 30 is a square of several millimeters by several millimeters to several tens of millimeters by several tens of millimeters, for example.

The pad 14c for electronic component mount exposed in the cavity 15z is formed with a slit-shaped opening 14d penetrating the pad 14c for electronic component mount and formed to expose the upper surface of the insulation layer 13. That is, the pad 14c for electronic component mount exposed in the cavity 15z is provided with a concave portion formed by an inner wall surface of the opening 14d and the upper surface of the insulation layer 13.

As shown in FIG. 1B, in the first exemplary embodiment, the opening 14d is formed to have an I-shaped planar shape (a shape of which a width is substantially thin and constant), for example. However, the width of the opening 14d may be changed, as required. For example, the planar shape of the opening 14d may be a wedge shape. Also, as seen from above, the opening 14d is provided substantially in parallel with a first side 301 (a left side, in FIG. 1B) of the electronic component 30 but may be inclined relative to the first side 301, as needed.

Also, in FIG. 1B, a length of the opening 14d is longer than the first side 301 of the electronic component 30. However, the present disclosure is not limited thereto. For example, the length of the opening 14d may be the same as the first side 301 of the electronic component 30 or may be shorter than the first side 301 of the electronic component 30. Also, the opening 14d is not limited to the configuration where it is equal with respect to a center of the first side 301 of the electronic component 30, and may be longer at an upper or lower side.

In the meantime, the technical meaning of the configuration where the pad 14c for electronic component mount is provided with the opening 14d will be separately described.

On the upper surface of the pad 14c for electronic component mount exposed in the cavity 15z, the electronic component 30 having a main body 31 and a wiring layer 32 formed on an upper surface of the main body 31 is mounted such that the opening 14d is exposed (such that it does not overlap the opening 14d, as seen from above). The wiring layer 32 includes pads 32a and a wiring pattern 32b. The electronic component 30 is, for example, a semiconductor chip, a capacitor, an inductor, a resistance or the like. The pad 32a and the wiring pattern 32b are formed of copper or the like, for example, and thicknesses thereof are substantially constant.

A lower surface of the main body 31 is fixed to the upper surface of the pad 14c for electronic component mount exposed in the cavity 15z, via an adhesive layer 34. The electronic component 30 may be mounted in the cavity 15z so that an upper surface of the main body 31 is to protrude more than an upper surface of the insulation layer 15, for example. As a material of the adhesive layer 34, for example, an insulating adhesive (for example, a die attach film) of which a main component is an epoxy-based resin or a polyimide-based resin, or the like may be used.

The wiring layer 16 is formed at one side of the insulation layer 15. The wiring layer 16 includes via-wirings 16a filled in via-holes 15x penetrating the insulation layer 15 and formed to expose an upper surface of the wiring layer 14 and a wiring pattern 16b formed on the upper surface of the insulation layer 15. The wiring pattern 16b is electrically connected to the wiring pattern 14b through the via-wiring 16a. The via-hole 15x may be formed as a concave portion having an inverted conical shape of which a diameter of an opening opened toward the insulation layer 17 is larger than a diameter of a bottom surface of an opening formed by the upper surface of the wiring layer 14. A material of the wiring layer 16 and a thickness of the wiring pattern 16b may be configured in the same manner as the wiring layer 12, for example.

The insulation layer 17 is formed on the upper surface of the insulation layer 15 with covering the electronic component 30 and the wiring layer 16. A part of the insulation layer 17 is provided in a gap formed between the cavity 15z and the electronic component 30 and in the opening 14d. For example, a part of the insulation layer 17 fills a gap formed between a sidewall of the cavity 15z and a side surface of the electronic component 30, and covers the sidewall of the cavity 15z, the side surface of the electronic component 30 and the upper surface of the pad 14c for electronic component mount. Also, a part of the insulation layer 17 is filled in the opening 14d. A material and a thickness of the insulation layer 17 may be configured in the same manner as the insulation layer 13, for example. The insulation layer 17 may contain a filler such as silica ($SiO_2$). A contained amount of the filler in the insulation layer 17 may be the same as in the insulation layer 13, for example.

The wiring layer 18 is formed at one side of the insulation layer 17. The wiring layer 18 includes via-wirings 18a filled in via-holes 17x penetrating the insulation layer 17 and formed to expose an upper surface of the wiring layer 16 or in via-holes 17y penetrating the insulation layer 17 and formed to expose upper surfaces of the pads 32a, and a wiring pattern 18b formed on an upper surface of the insulation layer 17. A part of the wiring pattern 18b is electrically connected to the wiring pattern 16b, through the via-wirings 18a penetrating the insulation layer 17. A part of the wiring pattern 18b is electrically connected to the pads 32a through the via-wiring 18a penetrating the insulation layer 17. The via-holes 17x, 17y may be respectively formed as a concave portion having an inverted conical shape of which a diameter of an opening opened toward the solder resist layer 19 is larger than a diameter of a bottom surface of an opening formed by the upper surface of the wiring layer 16 or the upper surface of the pad 32a. A material of the wiring layer 18 and a thickness of the wiring pattern 18b may be configured in the same manner as the wiring layer 12, for example.

The solder resist layer 19 is one outermost layer of the wiring substrate 1, and is formed on the upper surface of the insulation layer 17 so as to cover the wiring layer 18. The solder resist layer 19 may be formed of a photosensitive resin such as an epoxy-based resin, an acryl-based resin or the like, for example. A thickness of the solder resist layer 19 may be set to about 15 to 35 μm, for example.

The solder resist layer 19 has openings 19x, and parts of an upper surface of the wiring layer 18 are exposed to bottom portions of the openings 19x. A planar shape of the opening 19x may be circular, for example. If necessary, the upper surface of the wiring layer 18 to be exposed into the opening 19x may be formed with a metal layer or may be subjected to antioxidant processing such as OSP (Organic Solderability Preservative) processing. As the metal layer, an Au layer, a Ni/Au layer (a metal layer having a Ni layer and an Au stacked in corresponding order), a Ni/Pd/Au layer (a metal layer having a Ni layer, a Pd layer and an Au layer stacked in corresponding order), and the like may be exemplified.

The upper surface of the wiring layer 18 exposed to the bottom portions of the openings 19x is formed with external connection terminals 20. The external connection terminal 20 is a solder bump, for example. As a material of the solder bump, an alloy including Pb, an alloy of Sn and Cu, an alloy of Sn and Ag, an alloy of Sn, Ag and Cu, and the like may be used. The external connection terminal 20 is a terminal for electrical connection with a semiconductor chip.

The insulation layer 23 is formed on the other surface 10b of the core layer 10 so as to cover the wiring layer 22. A material and a thickness of the insulation layer 23 may be configured in the same manner as the insulation layer 13, for example. The insulation layer 23 may contain a filler such as silica ($SiO_2$). A contained amount of the filler in the insulation layer 23 may be the same as in the insulation layer 13, for example.

The wiring layer 24 is formed at the other side of the insulation layer 23. The wiring layer 24 includes via-wirings 24a filled in via-holes 23x penetrating the insulation layer 23 and formed to expose a lower surface of the wiring layer 22, and a wiring pattern 24b formed on a lower surface of the insulation layer 23. The wiring pattern 24b is electrically connected to the wiring layer 22, through the via-wirings 24a. The via-hole 23x may be formed as a concave portion having a conical shape of which a diameter of an opening opened toward the insulation layer 25 is larger than a diameter of a bottom surface of an opening formed by the lower surface of the wiring layer 22. A material and a thickness of the wiring layer 24 may be configured in the same manner as the wiring layer 12, for example.

The insulation layer 25 is formed on the lower surface of the insulation layer 23 so as to cover the wiring layer 24. A material and a thickness of the insulation layer 25 may be configured in the same manner as the insulation layer 13, for example. The insulation layer 25 may contain a filler such as silica ($SiO_2$). A contained amount of the filler in the insulation layer 25 may be the same as in the insulation layer 13, for example.

The wiring layer 26 is formed at the other side of the insulation layer 25. The wiring layer 26 includes via-wirings 26a filled in via-holes 25x penetrating the insulation layer 25 and formed to expose a lower surface of the wiring layer 24, and a wiring pattern 26b formed on a lower surface of the insulation layer 25. The wiring pattern 26b is electrically connected to the wiring layer 24, through the via-wirings 26a. The via-hole 25x may be formed as a concave portion having a conical shape of which a diameter of an opening opened toward the insulation layer 27 is larger than a diameter of a bottom surface of an opening formed by the lower surface of the wiring layer 24. A material and a thickness of the wiring layer 26 may be configured in the same manner as the wiring layer 12, for example.

The insulation layer 27 is formed on the lower surface of the insulation layer 25 so as to cover the wiring layer 26. A material and a thickness of the insulation layer 27 may be configured in the same manner as the insulation layer 13, for example. The insulation layer 27 may contain a filler such as silica ($SiO_2$). A contained amount of the filler in the insulation layer 27 may be the same as in the insulation layer 13.

The wiring layer 28 is formed at the other side of the insulation layer 27. The wiring layer 28 includes via-wirings 28a filled in via-holes 27x penetrating the insulation layer 27 and formed to expose a lower surface of the wiring layer 26, and a wiring pattern 28b formed on a lower surface of the insulation layer 27. The wiring pattern 28b is electrically connected to the wiring layer 26, through the via-wirings 28a. The via-hole 27x may be formed as a concave portion having a conical shape of which a diameter of an opening opened toward the solder resist layer 29 is larger than a diameter of a bottom surface of an opening formed by lower surface of the wiring layer 26. A material and a thickness of the wiring layer 28 may be configured in the same manner as the wiring layer 12, for example.

The solder resist layer 29 is the other outermost layer of the wiring substrate 1, and is formed on the lower surface of the insulation layer 27 so as to cover the wiring layer 28. A material and a thickness of the solder resist layer 29 may be configured in the same manner as the solder resist layer 19. The solder resist layer 29 has openings 29x, and parts of the lower surface of the wiring layer 28 are exposed in the openings 29x. A planar shape of the opening 29x may be circular, for example. The wiring layer 28 to be exposed in the openings 29x may be used as a pad for electrical connection with a mounting substrate (not shown) such as a motherboard. If necessary, the lower surface of the wiring layer 28 to be exposed in the opening 29x may be formed with the above-described metal layer or may be subjected to the antioxidant processing such as OSP processing.

Manufacturing Method of Wiring Substrate of First Exemplary Embodiment

Subsequently, a manufacturing method of the wiring substrate of the first exemplary embodiment is described. FIGS. 2 to 8B exemplify manufacturing processes of the wiring substrate of the first exemplary embodiment. In the meantime, an example of the process for manufacturing one wiring substrate is herein described. However, a plurality of parts becoming wiring substrates may be manufactured and divided into individual parts to make the respective wiring substrates.

Figure 2:
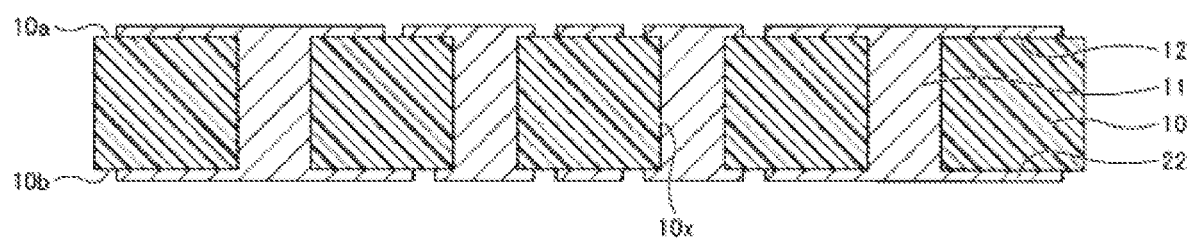
FIG. 2 is a view exemplifying a manufacturing process of the wiring substrate in accordance with the first exemplary embodiment (1 thereof)

First, in a process of FIG. 2, a core layer 10 is formed with through-wirings 11 and wiring layers 12, 22. Specifically, for example, a stacked plate where plain copper foils not patterned are formed on one surface and the other surface of the core layer 10 such as a so-called glass epoxy substrate is prepared. The copper foils on the respective surfaces of the prepared stacked plate are made to be thin, as required, and through-holes 10x penetrating the core layer 10 and the copper foils on the respective surfaces are formed by a laser processing method of using $CO_2$ laser or the like.

Then, desmear processing is performed to remove the remaining resin in the core layer 10, which is attached to the inner wall surfaces of the through-holes 10x, as needed. Then, a seed layer (copper or the like) configured to cover the copper foils on the respective surfaces and the inner wall surfaces of the through-holes 10x is formed by an electroless plating method, a sputter method or the like, for example, and an electrolytic plated layer (copper or the like) is formed on the seed layers by an electrolytic plating method in which the seed layer is used as a power feeding layer. Thereby, the through-holes 10x are filled by the electrolytic plated layer formed on the seed layer, and one surface and the other surface of the core layer 10 are formed with wiring layers 12, 22 in which the copper foil, the seed layer and the electrolytic plated layer are stacked. Then, the wiring layers 12, 22 are patterned into a predetermined planar shape by a subtractive method or the like.

Subsequently, in processes of FIGS. 3A and 3B, one surface of the core layer 10 is formed with an insulation layer 13 by laminating a semi-cured epoxy-based resin having a film shape so as to cover the wiring layer 12 and curing the same. Also, the other surface of the core layer 10 is formed with an insulation layer 23 by laminating a semi-cured epoxy-based resin having a film shape so as to cover the wiring layer 22 and curing the same. Alternatively, instead of the laminating of the epoxy-based resin having a film shape, a liquid form or paste-like epoxy-based resin or the like may be applied and cured to form the insulation layers 13, 23. A thickness of each of the insulation layers 13, 23 may be set to about 30 to 40 µm, for example. Each of the insulation layers 13, 23 may contain a filler such as silica ($SiO_2$).

Then, the insulation layer 13 is formed with via-holes 13x penetrating the insulation layer 13 and configured to expose an upper surface of the wiring layer 12. Also, the insulation layer 23 is formed with via-holes 23x penetrating the insulation layer 23 and configured to expose a lower surface of the wiring layer 22. The via-holes 13x, 23x may be formed by a laser processing method of using $CO_2$ laser or the like, for example. After forming the via-holes 13x, 23x, desmear processing is preferably performed to remove the remaining resin attached to surfaces of the wiring layers 12, 22 exposed to bottom portions of the via-holes 13x, 23x.

Subsequently, a wiring layer 14 is formed at one side of the insulation layer 13. The wiring layer 14 includes via-wirings 14a filled in the via-holes 13x, a wiring pattern 14b formed on an upper surface of the insulation layer 13, and a pad 14c for electronic component mount formed on the upper surface of the insulation layer 13. Also, the pad 14c for electronic component mount is formed with a slit-shaped opening 14d penetrating the pad 14c for electronic component mount and configured to expose the upper surface of the insulation layer 13. A planar shape and the like of the opening 14d are as described above. A material of the wiring layer 14 and thicknesses of the wiring pattern 14b and the pad 14c for electronic component mount may be configured in the same manner as the wiring layer 12, for example. The wiring layer 14 is electrically connected to the wiring layer 12 exposed to the bottom portions of the via-holes 13x.

Also, a wiring layer 24 is formed at the other side of the insulation layer 23. The wiring layer 24 includes via-wirings 24a filled in the via-holes 23x and a wiring pattern 24b formed on a lower surface of the insulation layer 23. A material of the wiring layer 24 and a thickness of the wiring pattern 24b may be configured in the same manner as the wiring layer 12, for example. The wiring layer 24 is electrically connected to the wiring layer 22 exposed to the bottom portions of the via-holes 23x. The wiring layers 14, 24 may be formed using a variety of wiring forming methods such as a semi-additive method, a subtractive method and the like.

For example, when forming the wiring layer 14 by the semi-additive method, the insulation layer 13 is formed with the via-holes 13x, and a seed layer is formed on a surface of the insulation layer 13 including inner walls of the via-holes 13x and a surface of the wiring layer 12 exposed in the via-holes 13x by electroless copper plating. Subsequently, a plated resist pattern having openings conforming to shapes of the wiring pattern 14b and the pad 14c for electronic component mount of the wiring layer 14 is formed on the seed layer, and then an electrolytic plated layer is deposited on the seed layer exposed to the openings of the plated resist pattern by electrolytic copper plating where power is feed from the seed layer. Then, the plated resist pattern is removed, an etching is performing by using the electrolytic plated layer as a mask and the seed layer exposed from the electrolytic plated layer is removed, so that the wiring layer 14 can be obtained.

Figure 3A:
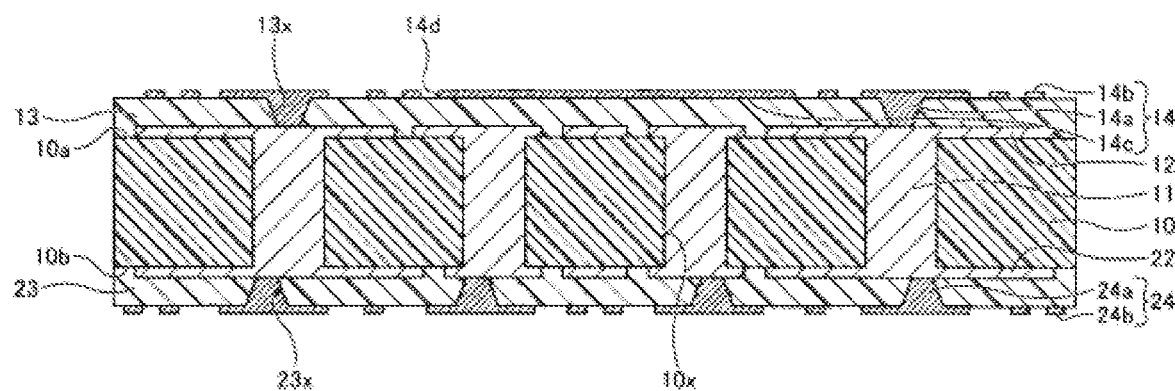
FIGS. 3A and 3B are views exemplifying a manufacturing process of the wiring substrate in accordance with the first exemplary embodiment (2 thereof)
Figure 3B:
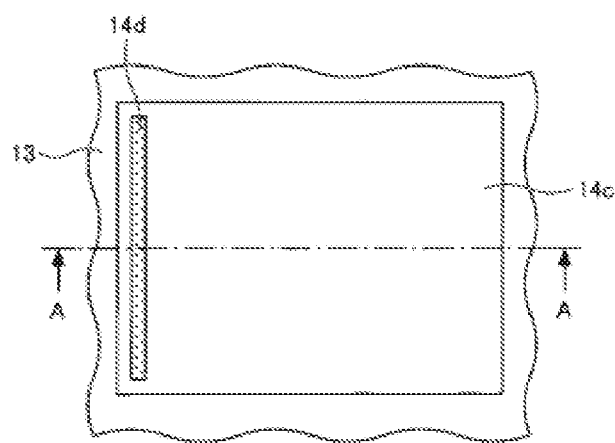

In the meantime, FIG. 3A is a sectional view, and FIG. 3B is a partial plan view depicting the pad for electronic component mount. The section of FIG. 3A in the vicinity of the pad for electronic component mount is a section taken along a line A-A of FIG. 3B.

Figure 4:
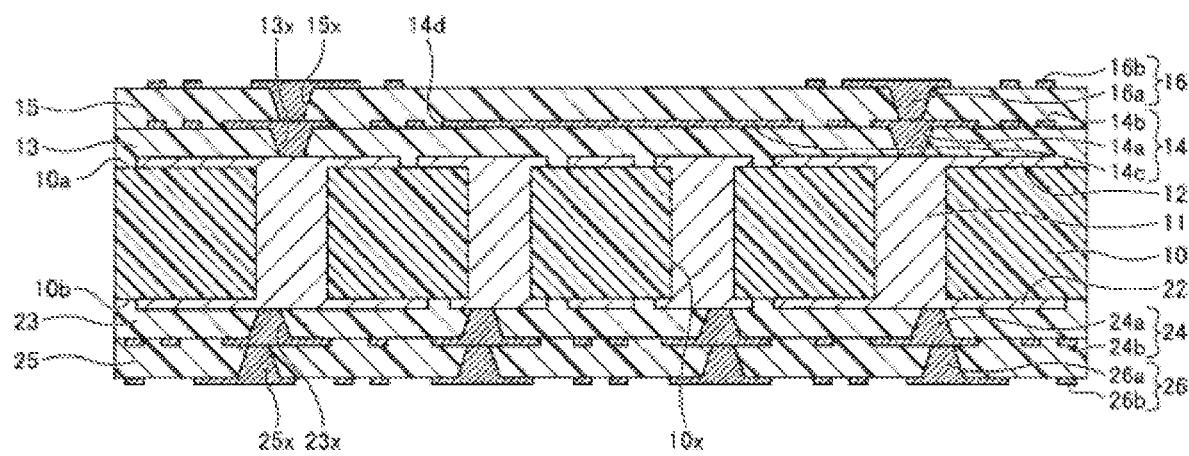
FIG. 4 is a view exemplifying a manufacturing process of the wiring substrate in accordance with the first exemplary embodiment (3 thereof)

Subsequently, in a process of FIG. 4, an insulation layer 15 is formed on the upper surface of the insulation layer 13 so as to cover the wiring layer 14 by the same formation method as the insulation layer 13. A material and a thickness of the insulation layer 15 may be configured in the same manner as the insulation layer 13, for example. Then, via-holes 15x are formed by the same method as the via-hole 13x. Then, a wiring layer 16 is formed at one side of the insulation layer 15 by the same formation method as the wiring layer 14. The wiring layer 16 includes via-wirings 16a filled in the via-holes 15x and a wiring pattern 16b formed on an upper surface of the insulation layer 15. A material of the wiring layer 16 and a thickness of the wiring pattern 16b may be configured in the same manner as the wiring layer 12, for example. The wiring layer 16 is electrically connected to the wiring layer 14 exposed to the bottom portions of the via-holes 15x.

Also, an insulation layer 25 is formed on a lower surface of the insulation layer 23 so as to cover the wiring layer 24 by the same method as the insulation layer 13. A material and a thickness of the insulation layer 25 may be configured in the same manner as the insulation layer 13, for example. Then, via-holes 25x are formed by the same method as the via-holes 13x. Then, a wiring layer 26 is formed at the other side of the insulation layer 25 by the same formation method as the wiring layer 14. The wiring layer 26 includes via-wiring 26a filled in the via-holes 25x and a wiring pattern 26b formed on a lower surface of the insulation layer 25. A material of the wiring layer 26 and a thickness of the wiring pattern 26b may be configured in the same manner as the wiring layer 12, for example. The wiring layer 26 is electrically connected to the wiring layer 24 exposed to the bottom portions of the via-holes 25x.

Figure 5A:
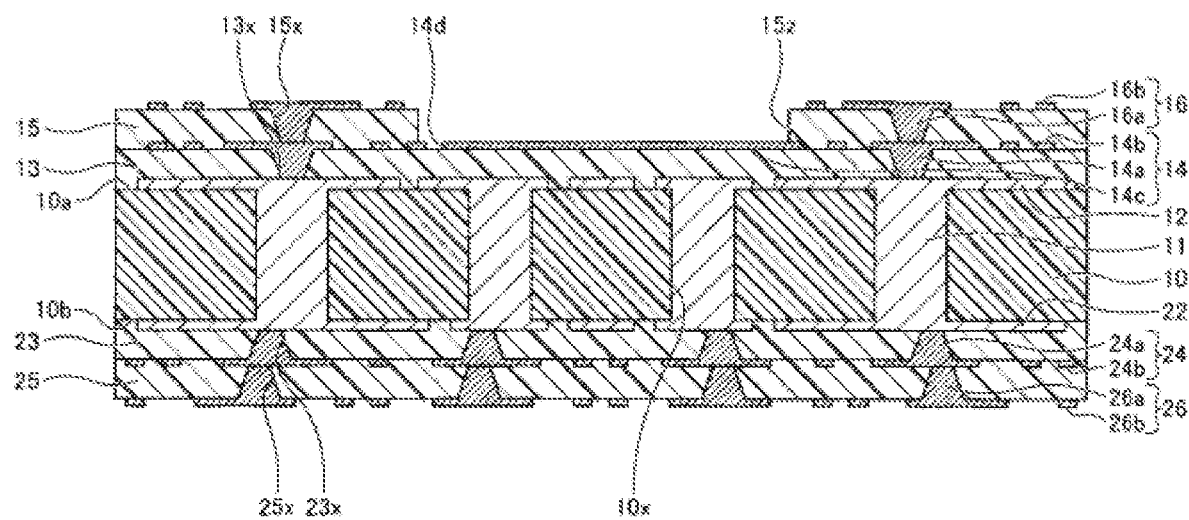
FIGS. 5A and 5B are views exemplifying a manufacturing process of the wiring substrate in accordance with the first exemplary embodiment (4 thereof)
Figure 5B:
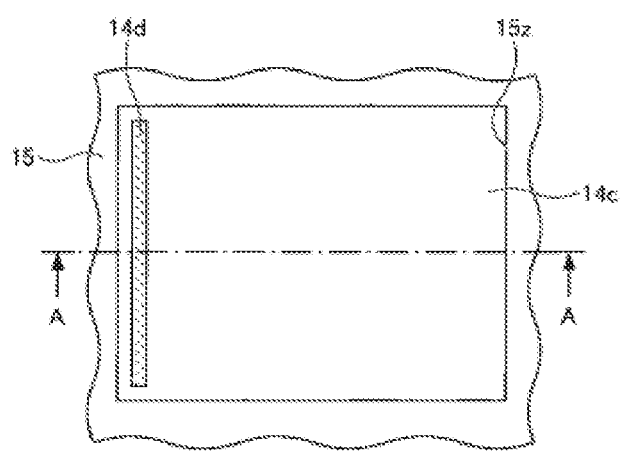

Subsequently, in processes of FIGS. 5A and 5B, the insulation layer 15 is formed with a cavity 15z configured to expose the upper surface of the pad 14c for electronic component mount and to expose the opening 14d of the pad 14c for electronic component mount. The cavity 15z is formed by a laser processing with respect to the insulation layer 15. A planar shape of the cavity 15z may be appropriately determined in conformity with a planar shape of an electronic component 30 that is to be disposed in the cavity 15z in a subsequent process. When the planar shape of the electronic component 30 is rectangular, the cavity 15z may be formed to have a rectangular planar shape slightly larger than the electronic component 30. In the meantime, FIG. 5A is a sectional view, and FIG. 5B is a partial plan view depicting the cavity. The section of FIG. 5A in the vicinity of the cavity is a section taken along a line A-A of FIG. 5B.

Figure 6A:
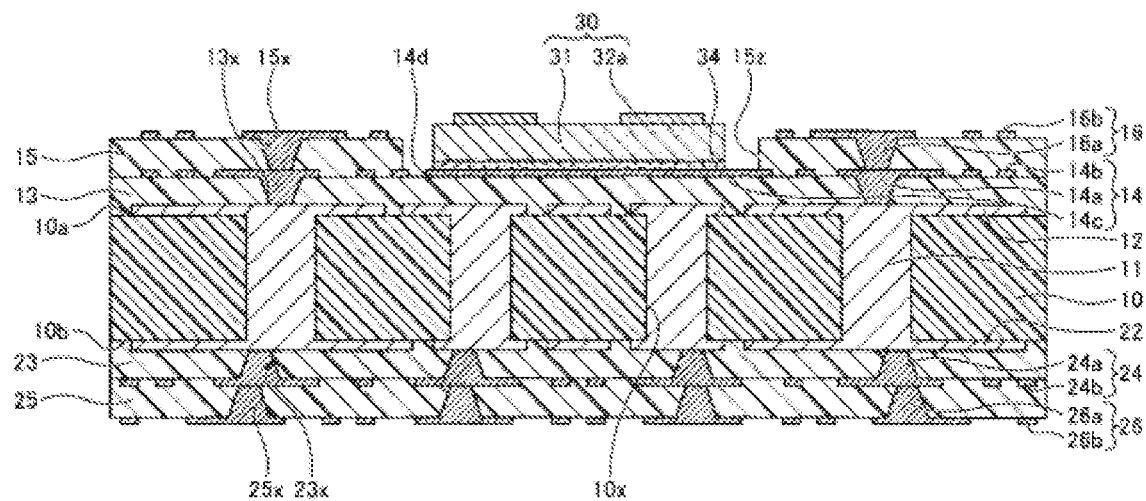
FIGS. 6A and 6B are views exemplifying a manufacturing process of the wiring substrate in accordance with the first exemplary embodiment (5 thereof)
Figure 6B:
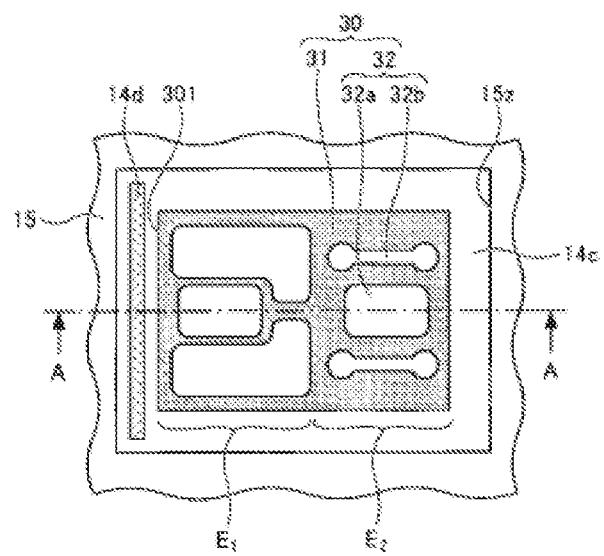

Then, in processes of FIGS. 6A and 6B, an electronic component 30 having a main body 31 and a wiring layer 32 is prepared. Then, the electronic component 30 is arranged on the upper surface of the pad 14c for electronic component mount exposed in the cavity 15z such that the opening 14d is to be exposed (such that it does not overlap the opening 14d, as seen from above). In the meantime, a lower surface of the electronic component 30 is formed thereon in advance with an adhesive layer 34. The adhesive layer 34 may be formed on the pad 14c for electronic component mount exposed in the cavity 15z, instead of being formed on the lower surface of the electronic component 30. In any case, the lower surface of the electronic component 30 is fixed to the upper surface of the pad 14c for electronic component mount exposed in the cavity via the adhesive layer 34. In the processes of FIGS. 6A and 6B, the adhesive layer 34 is not cured yet, so that the electronic component 30 is temporarily fixed in the cavity 15z. In the meantime, FIG. 6A is a sectional view, and FIG. 6B is a partial plan view depicting the cavity and the electronic component. The section of FIG. 6A in the vicinity of the cavity is a section taken along a line A-A of FIG. 6B.

Figure 7A:
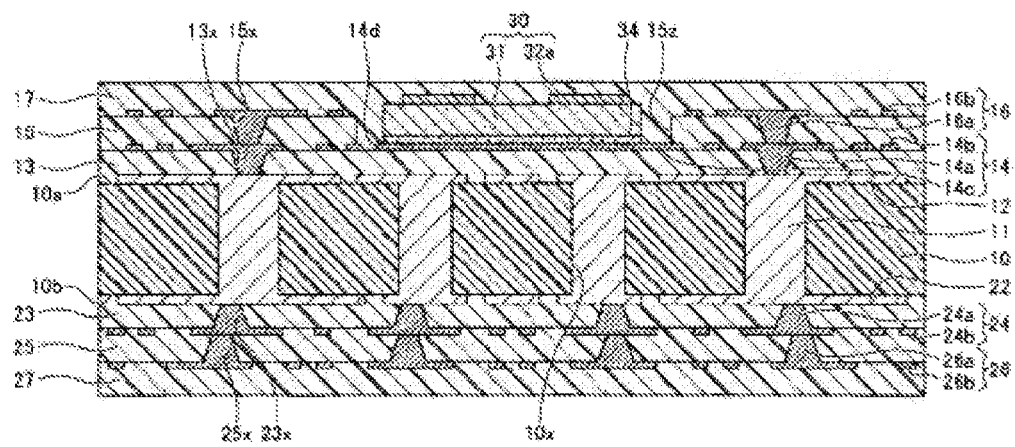
FIGS. 7A to 7C are views exemplifying a manufacturing process of the wiring substrate in accordance with the first exemplary embodiment (6 thereof)

Subsequently, in a process of FIG. 7A, a semi-cured epoxy-based resin or the like having a film shape is laminated so as to cover the electronic component 30 and the wiring layer 16, so that an insulation layer 17 is formed. Also, a semi-cured epoxy-based resin or the like having a film shape is laminated on the lower surface of insulation layer 25 so as to cover the wiring layer 26, so that an insulation layer 27 is formed. Alternatively, instead of laminating the epoxy-based resin or the like having a film shape, a liquid form or paste-like epoxy-based resin or the like may be applied to form the insulation layers 17, 27.

Then, while heating the laminated or applied insulation layers 17, 27, the upper surface of the insulation layer 17 and a lower surface of the insulation layer 27 are pressed in the direction of the core layer 10 with parallel flat plates. At this time, since the adhesive layer 34 is also heated, the melted insulation layer 17, insulation layer 27 and adhesive layer 34 are cured substantially at the same time. The insulation layer 17 covers the electronic component 30 and the wiring layer 16, and flows into a gap between a side surface of the electronic component 30 and an inner wall surface of the cavity 15z and into the opening 14d. A thickness of each of the insulation layers 17, 27 may be set to about 30 to 40 μm, for example. Each of the insulation layers 17, 27 may contain a filler such as silica ($SiO_2$).

Figure 7B:
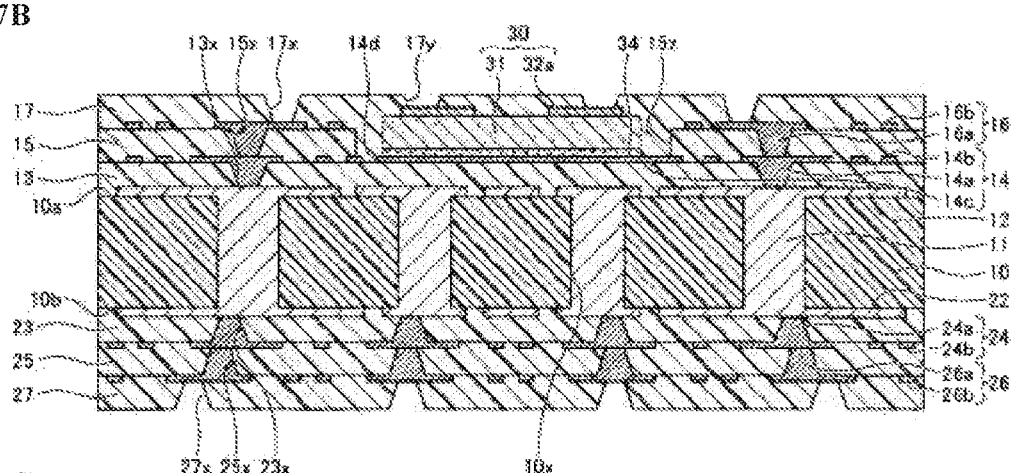

Subsequently, in a process of FIG. 7B, via-holes 17x penetrating the insulation layer 17 and configured to expose the upper surface of the wiring layer 16 and via-holes 17y penetrating the insulation layer 17 and configured to expose upper surfaces of pads 32a of the electronic component 30 are formed. Also, the insulation layer 27 is formed via-holes 27x penetrating the insulation layer 27 and configured to expose the lower surface of the wiring layer 26. The via-holes 17x, 17y, 27x may be formed by a laser processing method of using $CO_2$ laser or the like, for example. After forming the via-holes 17x, 17y, 27x, desmear processing is preferably performed to remove the remaining resin attached to surfaces of the wiring layer 16, the pads 32a and the wiring layer 26 exposed to bottom portions of the via-holes 17x, 17y, 27x.

Figure 7C:
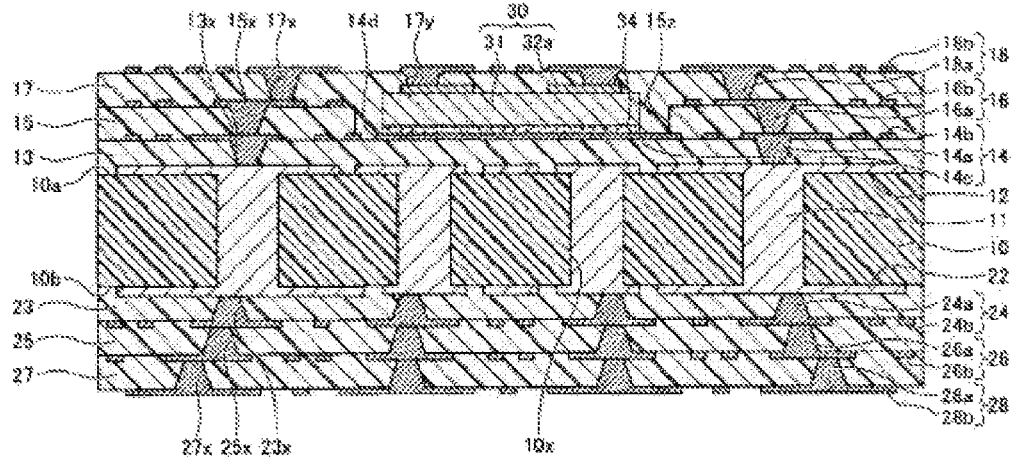

Subsequently, in a process of FIG. 7C, a wiring layer 18 is formed at one side of the insulation layer 17 by the same formation method as the wiring layer 14. The wiring layer 18 includes via-wirings 18a filled in the via-holes 17x or 17y and a wiring pattern 18b formed on the upper surface of the insulation layer 17. A material of the wiring layer 18 and a thickness of the wiring pattern 18b may be configured in the same manner as the wiring layer 12, for example. The wiring layer 18 is electrically connected to the wiring layer 16 exposed to the bottom portions of the via-holes 17x or the pads 32a exposed to the bottom portions of the via-holes 17y.

Also, a wiring layer 28 is formed at the other side of the insulation layer 27 by the same formation method as the wiring layer 14. The wiring layer 28 includes via-wirings 28a filled in the via-holes 27x and a wiring pattern 28b formed on the lower surface of the insulation layer 27. A material of the wiring layer 28 and a thickness of the wiring pattern 28b may be configured in the same manner as the wiring layer 12, for example. The wiring layer 28 is electrically connected to the wiring layer 26 exposed to the bottom portions of the via-holes 27x.

Figure 8A:
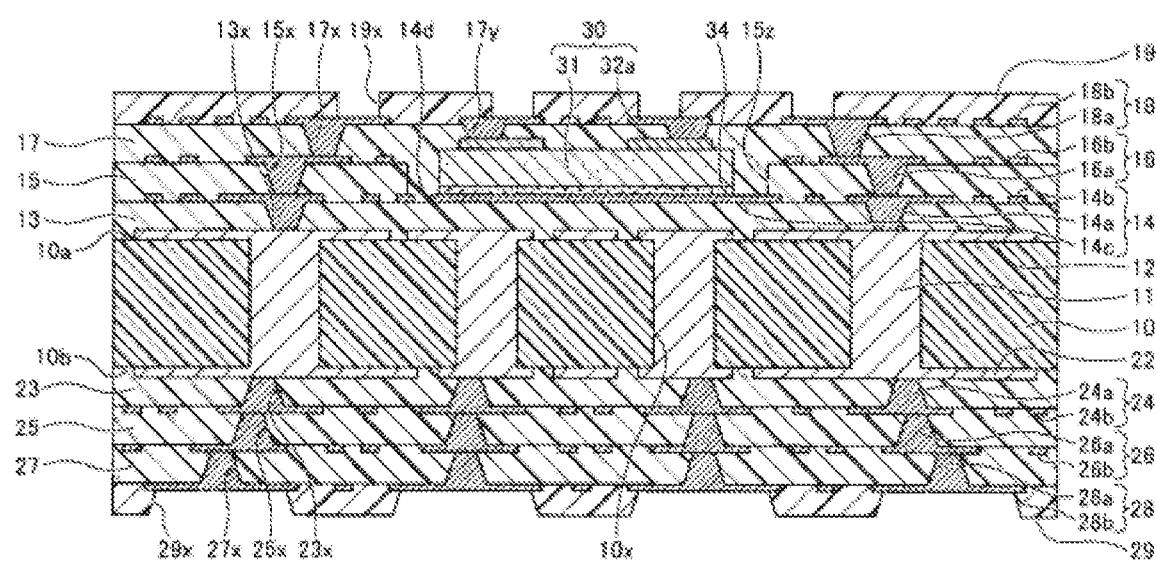
FIGS. 8A and 8B are views exemplifying a manufacturing process of the wiring substrate in accordance with the first exemplary embodiment (7 thereof)

Subsequently, in a process of FIG. 8A, a solder resist layer 19 is formed on the upper surface of the insulation layer 17 so as to cover the wiring layer 18. Also, a solder resist layer 29 is formed on the lower surface of the insulation layer 27 so as to cover the wiring layer 28. The solder resist layer 19 may be formed by applying a liquid form or paste-like photosensitive epoxy-based insulating resin or acryl-based insulating resin to the upper surface of the insulation layer 17 so as to cover the wiring layer 18 by a screen printing method, a roll coat method, a spin coat method or the like. Alternatively, for example, the solder resist layer 19 may be formed by laminating a photosensitive epoxy-based insulating resin or acryl-based insulating resin having a film shape on the upper surface of the insulation layer 17 so as to cover the wiring layer 18. The formation method of the solder resist layer 29 is the same as the solder resist layer 19.

Subsequently, by exposing and developing the solder resist layers 19, 29, the solder resist layer 19 is formed with openings 19x configured to expose portions of the upper surface of the wiring layer 18 (photolithography method). Also, the solder resist layer 29 is formed with openings 29x configured to expose portions of the lower surface of the wiring layer 28 (photolithography method). In the meantime, the openings 19x, 29x may be formed by laser processing or blast processing, too. In this case, the photosensitive material may not be used for the solder resist layers 19, 29. A planar shape of each of the openings 19x, 29x may be circular, for example. A diameter of each of the openings 19x, 29x may be arbitrarily designed in conformity with a connection target (a semiconductor chip, a motherboard and the like).

Meanwhile, in the above process, the upper surface of the wiring layer 18 exposed to the bottom portions of the openings 19x and the lower surface of the wiring layer 28 exposed to the bottom portions of the openings 29x may be formed with the above-described metal layers by the electroless plating method or the like. Also, instead of forming the metal layers, antioxidant processing such as OSP processing may be performed.

Figure 8B:
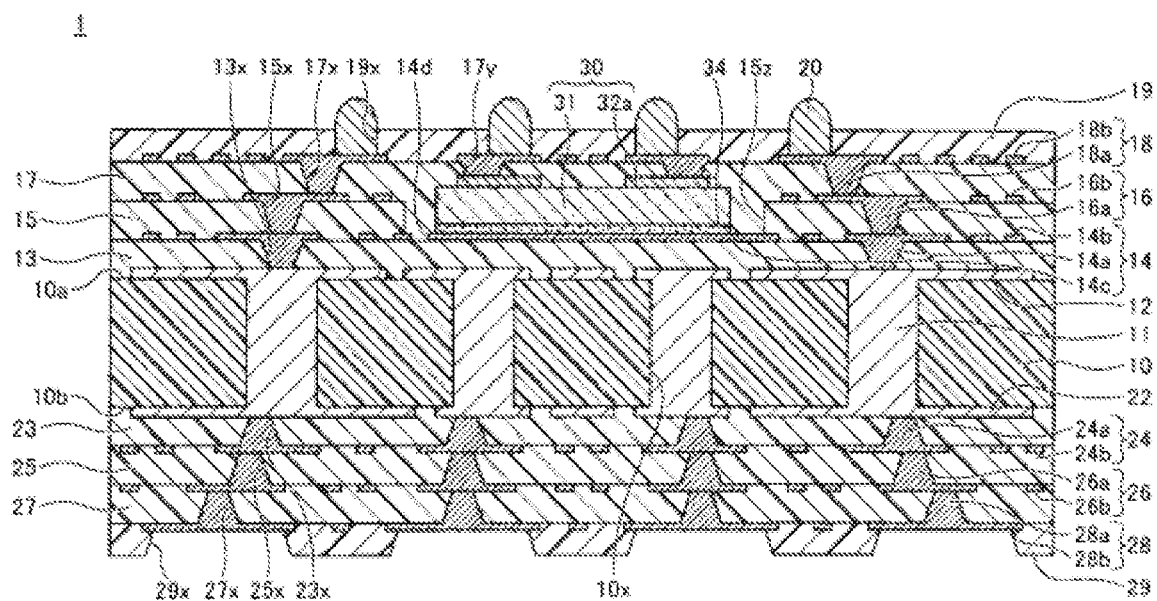

Subsequently, in a process of FIG. 8B, the upper surface of the wiring layer 18 exposed to the bottom portions of the openings 19x is formed with external connection terminals 20 such as solder bumps. The external connection terminal 20 is a terminal for electrical connection with a semiconductor chip.

Here, effects of the structure where the pad 14c for electronic component mount exposed in the cavity 15z is provided with the opening 14d are described.

The electronic component 30 has the wiring layer 32 and the concave portion formed around the wiring layer 32, as the outermost layer of the insulation layer 17-side. That is, the concave portion is a part of the outermost layer, in which the wiring layer 32 is not formed.

The thickness of the wiring layer 32 of the electronic component 30 is substantially constant. However, a density of the wiring layer 32 is not constant and is different depending on regions. For example, as shown in FIG. 1B, the planar shape of the electronic component 30 is rectangular. In this case, a surface region of the electronic component 30 having the rectangular planar shape is equally bisected, and the divided regions may be defined as a region $E_1$ and a region $E_2$. For example, in the region $E_1$ of the electronic component 30 shown in FIG. 1B, the density of the wiring layer 32 is relatively high, and in the region $E_2$, the density of the wiring layer 32 is relatively low.

In other words, the concave portions formed in the outermost layer of the electronic component 30 facing toward the insulation layer 17 has a predetermined volume distribution. In FIG. 1B, a volume of the concave portion is relatively small in the region $E_1$, and a volume of the concave portion is relatively large in the region $E_2$. Meanwhile, in FIG. 1B, the bottom surface of the concave portion is shown with a satin pattern, and it can be seen that an area of the bottom surface of the concave portion in the region $E_2$ is larger than an area of the bottom surface of the concave portion in the region $E_1$. Since the thickness of the wiring layer 32 is substantially constant, it can be easily understood that the volume of the concave portion in the region $E_1$ is relatively small and the volume of the concave portion in the region $E_2$ is relatively large.

Here, a case where the pad 14*c* for electronic component mount exposed in the cavity 15*z* is not formed with the opening 14*d* is considered.

In this case, when forming the insulation layer 17 to cover the electronic component 30, the melted resin becoming the insulation layer 17 more flows into the concave portion in the region $E_2$ where the volume of the concave portion is relatively large, as compared to the region $E_1$ where the volume of the concave portion is relatively small. For this reason, a thickness of the insulation layer 17 formed on the region $E_1$ is thicker than a thickness of the insulation layer 17 formed on the region $E_2$, and the resin is cured in this state, so that the insulation layer 17 is formed.

In this state, when the via-holes 17*x*, 17*y* are formed in the insulation layer 17, the thicker the thickness of the insulation layer 17 is, the deeper the via-hole 17*y* is and the smaller an area of the bottom portion of the via-hole 17*y* (=an area of the pad 32*a* exposed to the bottom portion of the via-hole 17*y*) is. As a result, connection reliability between the wiring pattern 18*b* and the pads 32*a* through the via-holes 17*y* is lowered in the region $E_1$ where the thickness of the insulation layer 17 is thicker.

In contrast, in the wiring substrate 1, the pad 14*c* for electronic component mount exposed in the cavity 15*z* is formed with the opening 14*d*, and a position and a size (volume) of the opening 14*d* are determined on the basis of the volume distribution of the concave portions formed in the outermost layer of the electronic component 30 facing toward the insulation layer 17. Specifically, as seen from above, the opening 14*d* is formed at a position (for example, a vicinity of the first side 301 of the electronic component 30) closer to the region $E_1$ where the volume of the concave portion is relatively small than the region $E_2$ where the volume of the concave portion is relatively large.

Thereby, in the process of forming the insulation layer 17, since the melted resin becoming the insulation layer 17 flows into the opening 14*d*, the thickness of the insulation layer 17 formed on the region $E_1$ is substantially the same as the thickness of the insulation layer 17 formed on the region $E_2$. In other words, the position and size of the opening 14*d* are set so that the thickness of the insulation layer 17 formed on the region $E_1$ is substantially to be the same as the thickness of the insulation layer 17 formed on the region $E_2$.

Thereby, the depth of the via-hole 17*y* and the area of the bottom portion of the via-hole 17*y* (=the area of the pad 32*a* exposed to the bottom portion of the via-hole 17*y*) are also substantially equal between the region $E_1$ and the region $E_2$.

As a result, since the area of the bottom portion of the via-hole 17*y* is not extremely reduced, it is possible to improve the connection reliability between the wiring pattern 18*b* and the pads 32*a* through the via-holes 17*y*.

In the meantime, in the structure where the pad 14*c* for electronic component mount exposed in the cavity 15*z* is formed with the opening 14*d*, so that the thickness of the insulation layer 17 on the electronic component 30 is uniform, as compared to a configuration where the opening 14*d* is not formed, it can be said that "the position and size of the opening 14*d* are determined on the basis of the volume distribution of the concave portions formed in the outermost layer of the electronic component 30 facing toward the insulation layer 17".

Also, in the example of FIG. 1B, the volume distribution of the concave portions is compared in the two regions of the region $E_1$ and the region $E_2$. However, the position and size of the opening 14*d* may be determined on the basis of a result of comparison of the volume distribution of the concave portions in the more divided regions.

First Modified Embodiment of First Exemplary Embodiment

In a first modified embodiment of the first exemplary embodiment, an example where an electronic component having a shape different from the first exemplary embodiment is described. Meanwhile, in the first modified embodiment of the first exemplary embodiment, the descriptions of the same parts as the exemplary embodiment described already may be omitted.

Figure 9A:
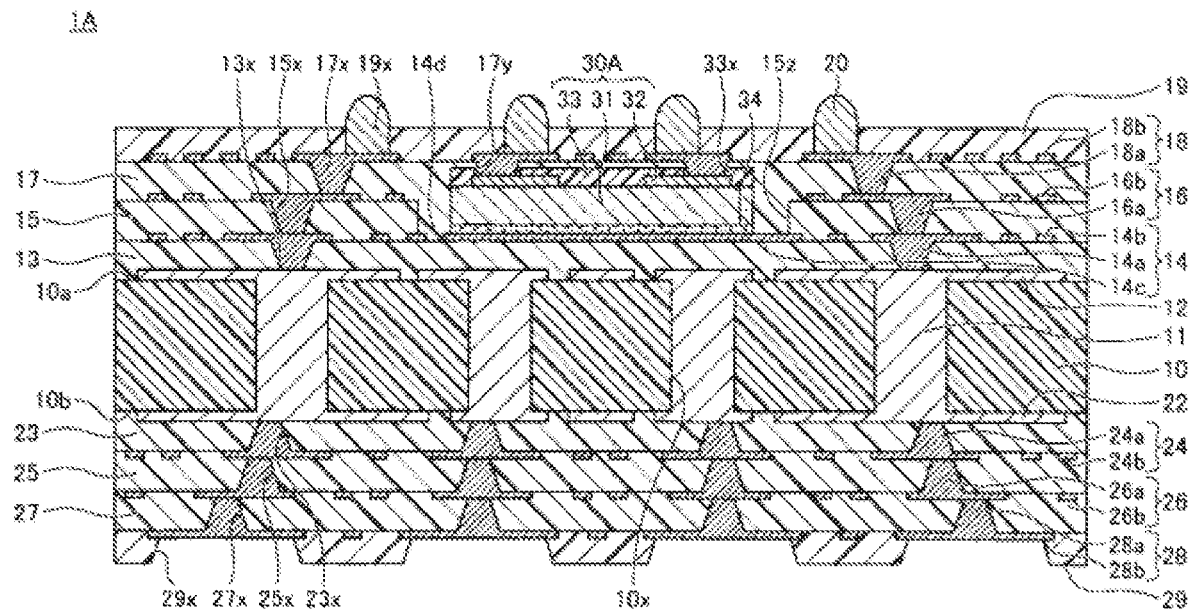
FIGS. 9A and 9B are views exemplifying a wiring substrate in accordance with a first modified embodiment of the first exemplary embodiment.
Figure 9B:
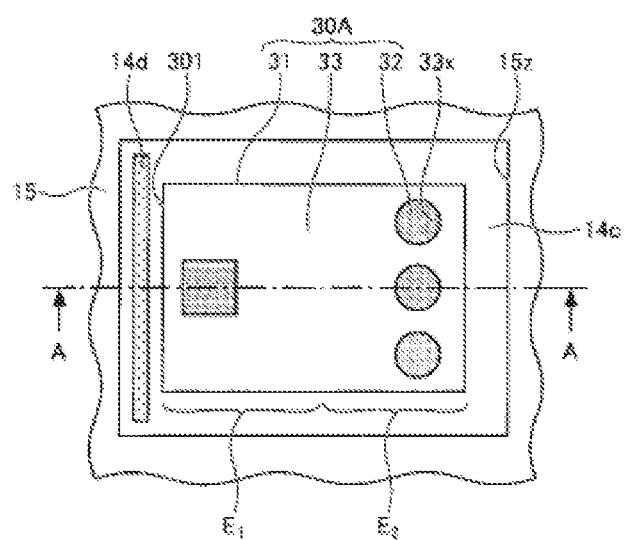

FIGS. 9A and 9B exemplify a wiring substrate in accordance with the first modified embodiment of first exemplary embodiment, in which FIG. 9A is a sectional view and FIG. 9B is a partial plan view depicting the cavity and the electronic component. In the meantime, the section of FIG. 9A in the vicinity of the cavity and the electronic component is a section taken along a line B-B of FIG. 9B. Also, in FIG. 9B, the upper layers (the insulation layer 17, the wiring layer 18, the solder resist layer 19, and the external connection terminal 20) of an electronic component 30A are not shown.

Referring to FIG. 9A, a wiring substrate 1A is different from the wiring substrate 1 (refer to FIG. 1A), in that the electronic component 30 is replaced with the electronic component 30A.

The electronic component 30A has a protective layer 33 configured to cover the wiring layer 32, which is formed on the upper surface of the main body 31, and the wiring layer 32 is selectively exposed to openings 33*x* formed in the protective layer 33. The wiring layer 32 exposed in the openings 33*x* functions as a pad. In the electronic component 30A, the openings 33*x* formed in the protective layer 33 and configured to expose the wiring layer 32 are concave portions. In the electronic component 30A, a volume of the concave portion in the region $E_1$ is relatively small, and a volume of the concave portion in the region $E_2$ is relatively large.

In the wiring substrate 1A, the pad 14*c* for electronic component mount exposed in the cavity 15*z* is formed with the opening 14*d*, and the position and size of the opening 14*d* are determined on the basis of a volume distribution of the concave portions formed in the outermost layer of the electronic component 30A facing toward the insulation layer 17. Specifically, as seen from above, the opening 14*d* is formed at a position (for example, a vicinity of the first side 301 of the electronic component 30A) closer to the region $E_1$ where the volume of the concave portion is relatively small than the region $E_2$ where the volume of the concave portion is relatively large.

Thereby, in the process of forming the insulation layer 17, since the melted resin becoming the insulation layer 17 flows into the opening 14d, the thickness of the insulation layer 17 formed on the region $E_1$ is substantially the same as the thickness of the insulation layer 17 formed on the region $E_2$. In other words, the position and size of the opening 14d are set so that the thickness of the insulation layer 17 formed on the region $E_1$ is substantially to be the same as the thickness of the insulation layer 17 formed on the region $E_2$.

Thereby, the depth of the via-hole 17y and the area of the bottom portion of the via-hole 17y (=the area of the pad 32a exposed to the bottom portion of the via-hole 17y) are also substantially equal between the region $E_1$ and the region $E_2$. As a result, since the area of the bottom portion of the via-hole 17y is not extremely reduced, it is possible to improve the connection reliability between the wiring pattern 18b and the wiring layer 32 through the via-holes 17y.

Also, in the example of FIG. 9B, the volume distribution of the concave portions is compared in the two regions of the region $E_1$ and the region $E_2$. However, the position and size of the opening 14d may be determined on the basis of a result of comparison of the volume distribution of the concave portions in the more divided regions.

Second Modified Embodiment of First Exemplary Embodiment

In a second modified embodiment of the first exemplary embodiment, an example where the insulation layer is formed with a groove portion configured to communicate with the opening of the pad for electronic component mount is described. Meanwhile, in the second modified embodiment of the first exemplary embodiment, the descriptions of the same parts as the exemplary embodiment described already may be omitted.

Figure 10A:
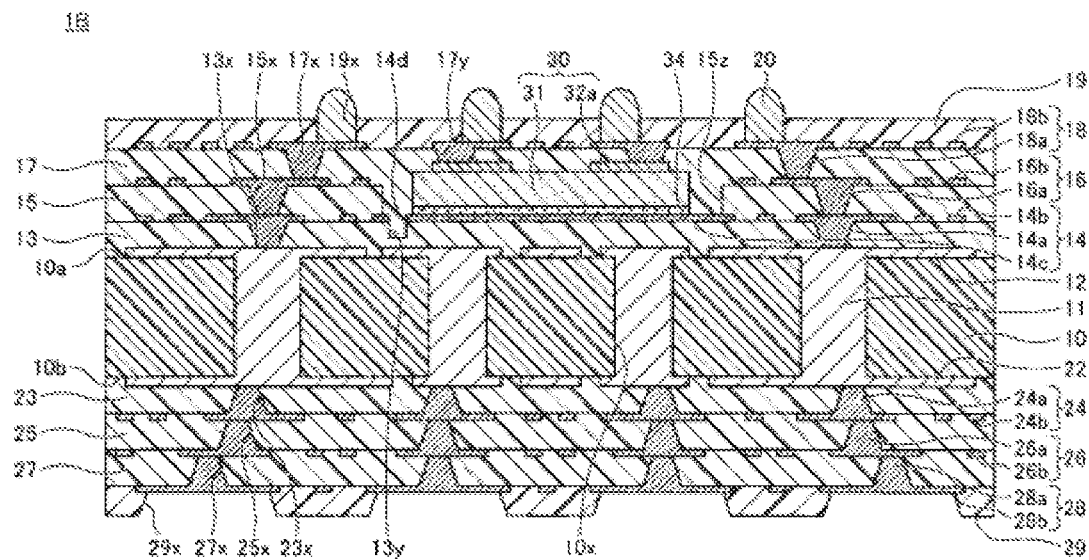
FIGS. 10A and 10B are sectional views exemplifying a wiring substrate in accordance with a second modified embodiment of the first exemplary embodiment.

FIG. 10A is a sectional view (1 thereof) exemplifying a wiring substrate in accordance with the second modified embodiment of the first exemplary embodiment. Referring to FIG. 10A, a wiring substrate 1B is different from the wiring substrate 1 (refer to FIG. 1A), in that the insulation layer 13 is formed with a groove portion 13y configured to communicate with the opening 14d of the pad 14c for electronic component mount. The groove portion 13y does not penetrate the insulation layer 13. A planar shape of the groove portion 13y is substantially the same as the planar shape of the opening 14d.

A part of the insulation layer 17 is provided in the gap formed between the cavity 15z and the electronic component 30, the opening 14d, and the groove portion 13y. For example, a part of the insulation layer 17 fills the gap formed between the sidewall of the cavity 15z and the side surface of the electronic component 30, and covers the sidewall of the cavity 15z, the side surface of the electronic component 30, and the upper surface of the pad 14c for electronic component mount. A part of the insulation layer 17 is filled in the opening 14d and the groove portion 13y.

Figure 10B:
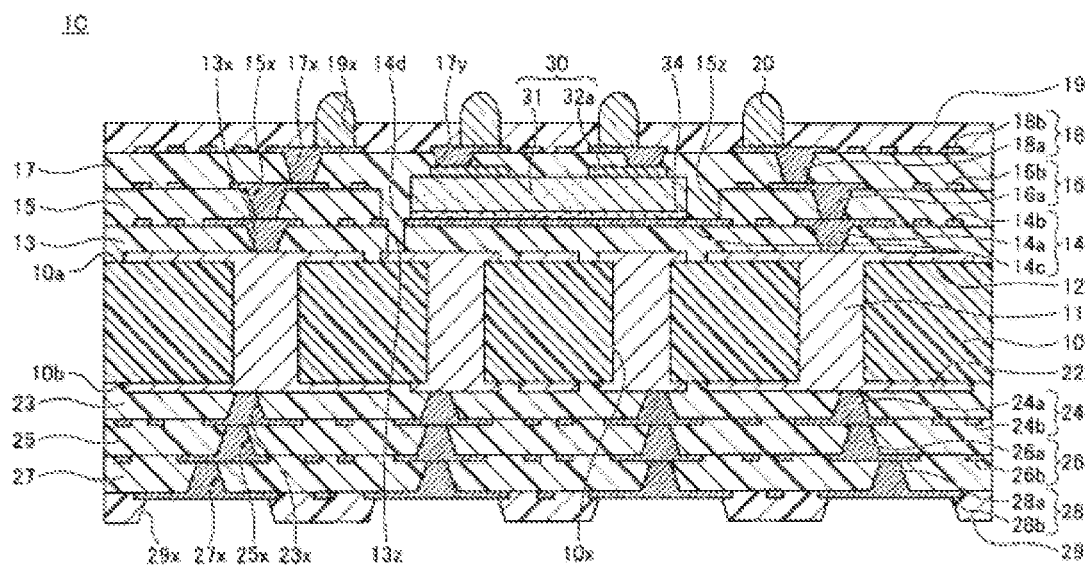

FIG. 10B is a sectional view (2 thereof) exemplifying a wiring substrate in accordance with the second modified embodiment of the first exemplary embodiment. Referring to FIG. 10B, a wiring substrate 1C is different from the wiring substrate 1 (refer to FIG. 1A), in that the insulation layer 13 is formed with a groove portion 13z configured to communicate with the opening 14d of the pad 14c for electronic component mount. The groove portion 13z penetrates the insulation layer 13, and a bottom surface of the groove portion 13z is formed by the upper surface of the wiring layer 12. A planar shape of the groove portion 13z is substantially the same as the planar shape of the opening 14d.

A part of the insulation layer 17 is provided in the gap formed between the cavity 15z and the electronic component 30, the opening 14d, and the groove portion 13z. For example, a part of the insulation layer 17 fills the gap formed between the sidewall of the cavity 15z and the side surface of the electronic component 30, and covers the sidewall of the cavity 15z, the side surface of the electronic component 30, and the upper surface of the pad 14c for electronic component mount. A part of the insulation layer 17 is filled in the opening 14d and the groove portion 13z.

The groove portion 13y shown in FIG. 10A and the groove portion 13z shown in FIG. 10B may be formed by irradiating an inside of the opening 14 with a laser light to partially remove the resin configuring the insulation layer 13, after the process of FIG. 3A of the first exemplary embodiment, for example. In this case, since the pad 14c for electronic component mount in the vicinity of the opening 14d functions as a mask, it is possible to easily irradiate the inside of the opening 14d with the laser light. A depth of the groove portion to be formed in the insulation layer 13 and a configuration as to whether the groove portion is to be formed to penetrate the insulation layer 13 can be controlled by intensity and irradiation time of the laser light to be irradiated.

In this way, the insulation layer 13 may be formed with the groove portion 13y or 13z configured to communicate with the opening 14d. Thereby, it is possible to easily enlarge a space into which the melted resin becoming the insulation layer 17 is to flow, without enlarging the planar shape of the opening 14d.

Third Modified Embodiment of First Exemplary Embodiment

In a third modified embodiment of the first exemplary embodiment, variation examples of the planar shape of the opening to be formed in the pad for electronic component mount are described. Meanwhile, in the third modified embodiment of the first exemplary embodiment, the descriptions of the same parts as the exemplary embodiment described already may be omitted.

FIGS. 11A to 11E are partial plan views exemplifying variations of the planar shape of the opening to be formed in the pad for electronic component mount.

In order to make the thickness of the insulation layer 17 to be formed on the region $E_1$ substantially be the same as the thickness of the insulation layer 17 to be formed on the region $E_2$, the opening is preferably formed at a position of the pad 14c for electronic component mount closer to the region $E_1$ where the volume of the concave portion is relatively small than the region $E_2$ where the volume of the concave portion is relatively large, as seen from above. To this end, the planar shape of the opening is not limited to the I-shape, like the opening 14d shown in FIG. 1B, and may be formed, like shapes shown in FIGS. 11A to 11E.

A planar shape of an opening 14e shown in FIG. 11A has a U-shape where it is provided to face the first side 301 of the electronic component 30, a part of a second side 302 (an upper side, in FIG. 11A) continuing to one end of the first side 301 and a part of a third side 303 (a lower side, in FIG. 11A) continuing to the other end of the first side 301.

A planar shape of an opening 14f shown in FIG. 11B has a square shape where it is provided to face the first side 301 of the electronic component 30, the second side 302, the third side 303, and a fourth side 304 (a right side, in FIG. 11B) connecting the second side 302 and the third side 303. A width of the part facing the first side 301 is wider than a width of the part facing the fourth side 304, and a width of the part facing the second side 302 and a width of the part facing the third side 303 are gradually widened from the fourth side 304 toward the first side 301.

A planar shape of an opening 14g shown in FIG. 11C, has such a shape that a plurality of rectangular portions is aligned side by side with predetermined intervals along the first side 301. A planar shape of an opening 14h shown in FIG. 11D has such a shape that a plurality of circular portions is aligned side by side with predetermined intervals along the first side 301. In the meantime, the opening 14g or 14h may have such a planar shape that a plurality of portions having any shape such as an elliptical or polygonal shape other than the rectangular and circular shape is aligned side by side with predetermined intervals along the first side 301. Also, each shape may be extended from the first side 301 toward the second side 302 or the third side 303.

Like this, when the position and size of the opening are determined on the basis of the volume distribution of the concave portions formed in the outermost layer of the electronic component 30 facing toward the insulation layer 17, the planar shape of the opening is not particularly limited, and may be formed to have the planar shape shown in FIGS. 11A to 11D or a more complicated planar shape.

Also, as shown in FIG. 11E, a plurality of electronic components may be mounted in the cavity 15z. In this case, for example, an electronic component 30B is an electronic component of which a volume of the concave portions in the outermost layer is relatively small, and an electronic component 30C is an electronic component of which a volume of the concave portions in the outermost layer is relatively large. As seen from above, the opening 14d is formed at a position closer to the electronic component 30B of which a volume of the concave portions in the outermost layer is relatively small than the electronic component 30C of which a volume of the concave portions in the outermost layer is relatively large.

Thereby, in the process of forming the insulation layer 17, since the melted resin becoming the insulation layer 17 flows into the opening 14d, the thickness of the insulation layer 17 to be formed on the electronic component 30B is substantially the same as the thickness of the insulation layer 17 to be formed on the electronic component 30C. In other words, the position and size of the opening 14d are set so that the thickness of the insulation layer 17 to be formed on the electronic component 30B is substantially to be the same as the thickness of the insulation layer 17 to be formed on the electronic component 30C.

Thereby, the depth of the via-hole 17y and the area of the bottom portion of the via-hole 17y (=the area of the pad 32a exposed to the bottom portion of the via-hole 17y) are also substantially equal between the electronic component 30B and the electronic component 30C. As a result, since the area of the bottom portion of the via-hole 17y is not extremely reduced, it is possible to improve the connection reliability between the wiring pattern 18b and the wiring layer 32 through the via-holes 17y.

In the example of FIG. 11E, the two electronic components are mounted in the cavity 15z. However, the three or more electronic components may be mounted in the cavity 15z. Also, the sizes of the electronic components to be mounted may be different. Also, the opening 14d may be replaced with the opening 14e shown in FIG. 11A, the opening 14f shown in FIG. 11B, the opening 14g shown in FIG. 11C, the opening 14h shown in FIG. 11D or an opening having another planar shape.

Application Examples of First Exemplary Embodiment

In an application example of the first exemplary embodiment, a semiconductor package where a semiconductor chip is mounted on the wiring substrate of the first exemplary embodiment is exemplified. In the application example of the first exemplary embodiment, the descriptions of the same parts as the exemplary embodiment described already may be omitted.

Figure 12:
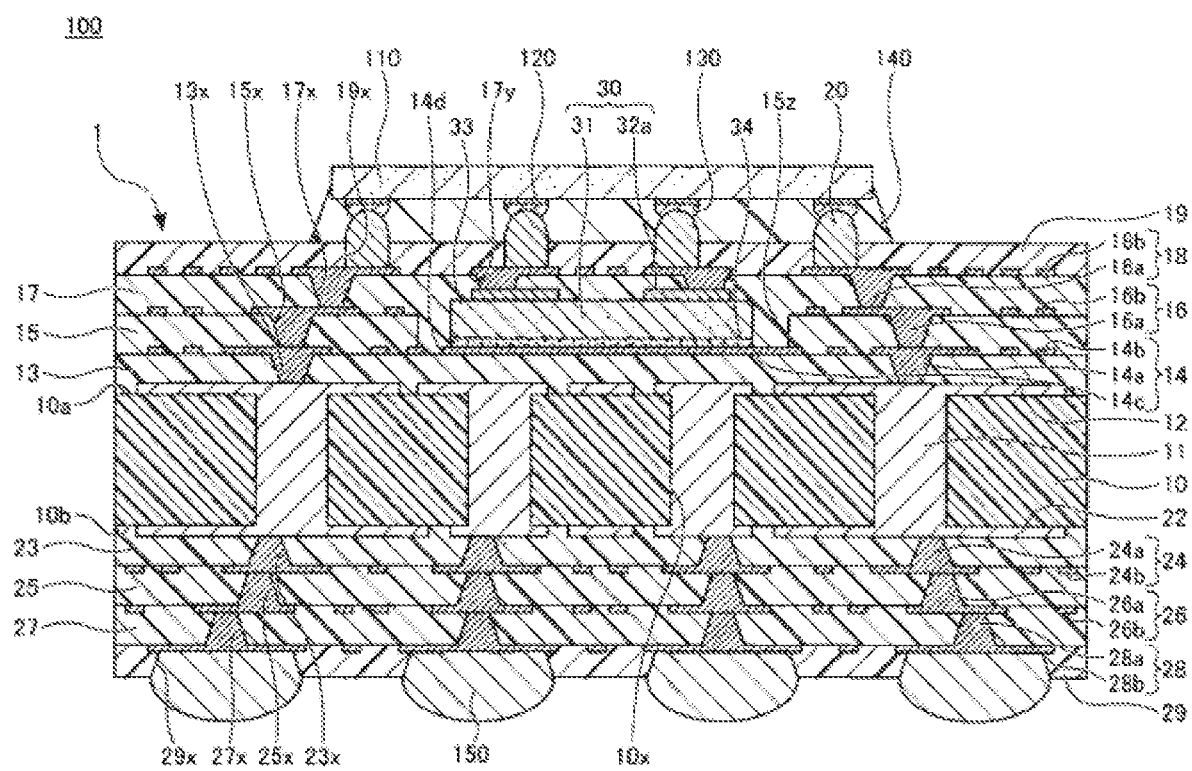
FIG. 12 is a sectional view exemplifying a semiconductor package relating to an application example of the first exemplary embodiment.

FIG. 12 is a sectional view exemplifying a semiconductor package in accordance with the application example of the first exemplary embodiment. Referring to FIG. 12, a semiconductor package 100 includes the wiring substrate 1 shown in FIG. 1A, a semiconductor chip 110, electrode pads 120, bumps 130, an under-fill resin 140, and bumps 150.

The semiconductor chip 110 has such a structure that a semiconductor integrated circuit (not shown) and the like are formed on a thin semiconductor substrate (not shown) formed of silicon or the like, for example. The semiconductor substrate (not shown) is formed with the electrode pads 120 electrically connected to the semiconductor integrated circuit (not shown).

The bump 130 are formed on the electrode pads 120 of the semiconductor chip 110, and are electrically connected to the external connection terminals 20 of the wiring substrate 1. The under-fill resin 140 is filled between the semiconductor chip 110 and the upper surface of the wiring substrate 1. The bumps 150 are formed on the lower surface of the wiring layer 28 exposed to the bottom portions of the openings 29x of the solder resist layer 29. The bumps 150 are connected to a motherboard or the like, for example. The bumps 130, 150 are solder bumps, for example. As a material of the solder hump, an alloy including Pb, an alloy of Sn and Cu, an alloy of Sn and Ag, an alloy of Sn, Ag and Cu and the like may be used.

In this way, the semiconductor chip is mounted on the wiring substrate of the first exemplary embodiment, so that it is possible to implement the semiconductor package. In the meantime, instead of the wiring substrate 1, the wiring substrate 1A, 1B or 1C may also be used.

Although the preferred embodiments have been described in detail, the present disclosure is not limited to the above embodiments and the embodiments can be diversely modified and replaced without departing from the scope defined in the claims.

For example, in the above embodiments, the present disclosure is applied to the wiring substrate including the core layer manufactured by a buildup process. However, the present disclosure can be applied to a cureless wiring substrate manufactured by the buildup process, too. Also, the present disclosure is not limited thereto, and can be applied to a variety of wiring substrates.

This disclosure further encompasses various exemplary embodiments, for example, described below.

1. A manufacturing method of a wiring substrate, comprising:

forming a first insulation layer with a cavity configured to expose a pad for electronic component mount;

forming an opening to penetrate the pad exposed in the cavity;

mounting an electronic component on the pad exposed in the cavity such that the opening is to be exposed; and forming a second insulation layer configured to cover the electronic component on the first insulation layer, wherein an outermost layer of the electronic component facing toward the second insulation layer is formed with a concave portion having a predetermined volume distribution, wherein a position and a size of the opening are determined on the basis of the predetermined volume distribution, and wherein in the formation of the second insulation layer, a resin becoming the second insulation layer is arranged on the first insulation layer so as to cover the electronic component and the resin is enabled to flow into the concave portion, into a gap between a side surface of the electronic component and an inner wall surface of the cavity, and into the opening.

2. The manufacturing method according to claim 1, further comprising:

forming a groove portion configured to communicate with the opening in a third insulation layer becoming a lower layer of the first insulation layer between the formation of the opening and the mounting of the electronic component, wherein in the formation of the second insulation layer, the resin is enabled to flow into the concave portion, into the gap between the side surface of the electronic component and the inner wall surface of the cavity, into the opening and into the groove portion.

3. The manufacturing method according to claim 2, wherein in the formation of the groove portion, the groove portion is formed so as to penetrate the third insulation layer and to expose a surface of a wiring layer becoming a lower layer of the third insulation layer.

What is claimed is:

1. A wiring substrate comprising:
   a pad for electronic component mount, the pad including an opening formed to penetrate the pad, the opening being defined entirely within the pad so as to be enclosed within an outer boundary of the pad;
   a first insulation layer having a cavity to which a portion of the pad is exposed;
   an electronic component mounted on the portion of the pad exposed in the cavity; and
   a second insulation layer formed on the first insulation layer with covering the electronic component,
   wherein the opening is formed so as to penetrate the portion of the pad which is exposed in the cavity, and the electronic component is mounted on the portion of the pad which is exposed in the cavity so that the opening is exposed,
   wherein an outermost layer of the electronic component facing toward the second insulation layer comprises a concave portion having a predetermined volume distribution,
   wherein a position and a size of the opening are determined on the basis of the predetermined volume distribution, and
   wherein the second insulation layer is provided in the concave portion, provided in a gap between a side surface of the electronic component and an inner wall surface of the cavity, and provided in the opening.

2. The wiring substrate according to claim 1, wherein the outermost layer comprises a plurality of the concave portions,
   wherein the outermost layer comprises a region in which a volume of the concave portion is relatively small and a region in which a volume of the concave portion is relatively large, and
   wherein the opening is formed at a position closer to the region in which the volume of the concave portion is relatively small than the region in which the volume of the concave portion is relatively large, as seen from above.

3. The wiring substrate according to claim 1, wherein a plurality of the electronic components is mounted in the cavity,
   wherein the plurality of electronic components comprises an electronic component of which a volume of the concave portion in the outermost layer is relatively small and an electronic component of which a volume of the concave portion in the outermost layer is relatively large, and
   wherein the opening is formed at a position closer to the electronic component of which the volume of the concave portions is relatively small than the electronic component of which the volume of the concave portions is relatively large, as seen from above.

4. The wiring substrate according to claim 1, wherein the outermost layer comprises a wiring layer, and the concave portion is a portion of the outermost layer, in which the wiring layer is not formed.

5. The wiring substrate according to claim 1, wherein the outermost layer is a protective layer configured to cover a wiring layer, and the concave portion is an opening formed in the protective layer and configured to expose the wiring layer.

6. The wiring substrate according to claim 1, further comprising:
   a third insulation layer formed on a surface of the first insulation layer which is opposite to a surface where the second insulation layer is formed,
   wherein the pad is formed on the third insulation layer,
   wherein the third insulation layer includes a groove portion configured to communicate with the opening, and
   wherein the second insulation layer is provided in the concave portion, provided in the gap between the side surface of the electronic component and the inner wall surface of the cavity, and provided in the opening and the groove portion.

7. The wiring substrate according to claim 6, wherein the groove portion is formed to penetrate the third insulation layer, and
   wherein a bottom surface of the groove portion is formed by a surface of a wiring layer formed on a surface of the third insulation layer which is opposite to a surface where the first insulation layer is formed.

8. A wiring substrate comprising:
   a pad for electronic component mount, the pad including an opening formed to penetrate the pad;
   a first insulation layer having a cavity to which a portion of the pad is exposed;
   an electronic component mounted on the portion of the pad exposed in the cavity; and
   a second insulation layer formed on the first insulation layer with covering the electronic component,
   wherein the opening is formed so as to penetrate the portion of the pad which is exposed in the cavity, and the electronic component is mounted on the portion of the pad which is exposed in the cavity so that the opening is exposed, wherein an outermost layer of the electronic component facing toward the second insulation layer comprises a concave portion having a predetermined volume distribution, wherein a position and a size of the opening are determined on the basis of the predetermined volume distribution, wherein the second insulation layer is provided in the concave portion, provided in a gap between a side surface of the electronic component and an inner wall surface of the cavity, and provided in the opening, wherein the outermost layer comprises a plurality of the concave portions, wherein the outermost layer comprises a region in which a volume of the concave portion is relatively small and a region in which a volume of the concave portion is relatively large, and wherein the opening is formed at a position closer to the region in which the volume of the concave portion is relatively small than the region in which the volume of the concave portion is relatively large, as seen from above.

9. The wiring substrate according to claim 8, wherein the outermost layer comprises a wiring layer, and the concave portion is a portion of the outermost layer, in which the wiring layer is not formed.

10. The wiring substrate according to claim 8, wherein the outermost layer is a protective layer configured to cover a wiring layer, and the concave portion is an opening formed in the protective layer and configured to expose the wiring layer.

11. The wiring substrate according to claim 8, further comprising:

a third insulation layer formed on a surface of the first insulation layer which is opposite to a surface where the second insulation layer is formed, wherein the pad is formed on the third insulation layer, wherein the third insulation layer includes a groove portion configured to communicate with the opening, and wherein the second insulation layer is provided in the concave portion, provided in the gap between the side surface of the electronic component and the inner wall surface of the cavity, and provided in the opening and the groove portion.

12. The wiring substrate according to claim 11, wherein the groove portion is formed to penetrate the third insulation layer, and wherein a bottom surface of the groove portion is formed by a surface of a wiring layer formed on a surface of the third insulation layer which is opposite to a surface where the first insulation layer is formed.

13. A wiring substrate comprising:

a pad for electronic component mount, the pad including an opening formed to penetrate the pad;

a first insulation layer having a cavity to which a portion of the pad is exposed;

an electronic component mounted on the portion of the pad exposed in the cavity; and a second insulation layer formed on the first insulation layer with covering the electronic component, wherein the opening is formed so as to penetrate the portion of the pad which is exposed in the cavity, and the electronic component is mounted on the portion of the pad which is exposed in the cavity so that the opening is exposed, wherein an outermost layer of the electronic component facing toward the second insulation layer comprises a concave portion having a predetermined volume distribution, wherein a position and a size of the opening are determined on the basis of the predetermined volume distribution, wherein the second insulation layer is provided in the concave portion, provided in a gap between a side surface of the electronic component and an inner wall surface of the cavity, and provided in the opening, and wherein the outermost layer is a protective layer configured to cover a wiring layer, and the concave portion is an opening formed in the protective layer and configured to expose the wiring layer.

14. The wiring substrate according to claim 13, wherein a plurality of the electronic components is mounted in the cavity, wherein the plurality of electronic components comprises an electronic component of which a volume of the concave portion in the outermost layer is relatively small and an electronic component of which a volume of the concave portion in the outermost layer is relatively large, and wherein the opening is formed at a position closer to the electronic component of which the volume of the concave portions is relatively small than the electronic component of which the volume of the concave portions is relatively large, as seen from above.

15. The wiring substrate according to claim 13, further comprising:

a third insulation layer formed on a surface of the first insulation layer which is opposite to a surface where the second insulation layer is formed, wherein the pad is formed on the third insulation layer, wherein the third insulation layer includes a groove portion configured to communicate with the opening, and wherein the second insulation layer is provided in the concave portion, provided in the gap between the side surface of the plurality of electronic components and the inner wall surface of the cavity, and provided in the opening and the groove portion.

16. The wiring substrate according to claim 15, wherein the groove portion is formed to penetrate the third insulation layer, and wherein a bottom surface of the groove portion is formed by a surface of a wiring layer formed on a surface of the third insulation layer which is opposite to a surface where the first insulation layer is formed.

* * * * *